(12) United States Patent
Sandhu

(10) Patent No.: US 7,741,840 B1
(45) Date of Patent: Jun. 22, 2010

(54) MAGNETIC PROBE

(75) Inventor: Adarsh Sandhu, Kanagawa (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 12/540,766

(22) Filed: Aug. 13, 2009

(30) Foreign Application Priority Data

May 21, 2009 (JP) .............................. 2009-123183

(51) Int. Cl.
*G01R 33/02* (2006.01)
(52) U.S. Cl. ..................... 324/214; 324/260; 324/244.1
(58) Field of Classification Search ................. 324/214, 324/215, 244, 244.1, 260, 261, 262; 850/46, 850/48; 359/280, 296
See application file for complete search history.

(56) References Cited

U.S. PATENT DOCUMENTS 1,963,496 A * 6/1934 Land ........................... 359/296
4,267,509 A * 5/1981 Graham .................... 324/244.1

FOREIGN PATENT DOCUMENTS

JP    2001-281312 A    10/2001

OTHER PUBLICATIONS

Office Action issued in Japanese Application 2009-123183, mailed Jun. 10, 2009 (English translation included).

* cited by examiner

*Primary Examiner*—Kenneth J Whittington
(74) *Attorney, Agent, or Firm*—Foley & Lardner LLP

(57) ABSTRACT

A magnetic probe includes a tubular container, the inside of which can be observed and at least one end of which is closed, a paramagnetic seed which is fixed to an end of the tubular container, and a paramagnetic colloidal particle dispersion liquid that is filled in the tubular container.

8 Claims, 2 Drawing Sheets

MAGNETIC PROBE

BACKGROUND OF THE INVENTION

1. Field of the Invention

The present invention relates to a magnetic probe configured to detect magnetism by scanning a surface of a measurement target or moving the magnetic probe close to a measurement site.

2. Description of the Related Art

Recently, with an increase in the recording density of magnetic recording, magneto-optical recording etc. and a development of a magnetic scope, a technique for evaluating a magnetic property in a small area has been desired. A known example of such a technique is used of a Hall sensor probe (Patent document 1).

Prior Art Document

Patent Document

Patent Document 1: Japanese Unexamined Patent Application Publication No. 2001-281312

SUMMARY OF THE INVENTION

Problems to be Solved by the Invention

However, even in such a known Hall sensor probe, one end of which has a small width, the width of the end is 500 nm or more. Accordingly, the spatial resolution of the probe is also limited to such an extent. Consequently, a magnetic probe having a higher resolution has been desired.

According to a study made by the inventors of the present invention, it was found that when a paramagnetic seed is fixed to the inside of an end of a tubular container filled with a dispersion liquid of paramagnetic colloidal particles and the end is made to come closer to a magnetic field, the paramagnetic colloidal particles are aggregated from the paramagnetic seed, which functions as a starting point, in the form of a chain, and the length of the aggregation depends on the strength of the magnetic field.

Furthermore, it was found that when aggregation of the paramagnetic colloidal particles formed at the end of the tubular container is observed using this phenomenon, magnetism can be detected to provide a novel magnetic probe using a mechanism that is completely different from that of known magnetic probes.

In this magnetic probe, magnetism can be detected even in the case where ultrafine particles having a diameter of about several nanometers are used as the paramagnetic seed fixed to the inside of the end of the tubular container. Accordingly, a high spatial resolution of the order of several nanometers can be realized.

DETAILED DESCRIPTION OF THE INVENTION

Figure 1:
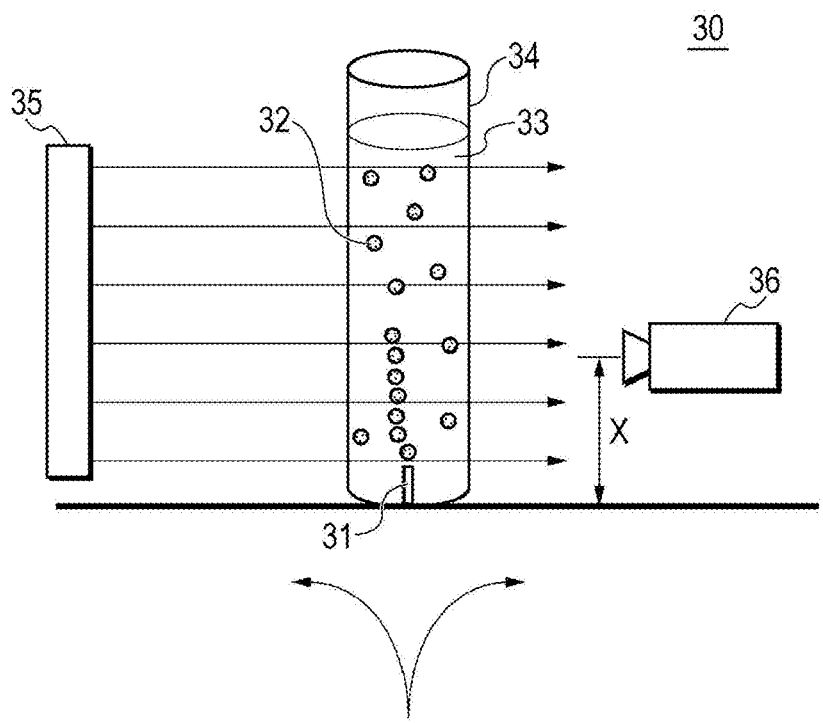
FIG. 1 is a schematic view of a magnetic probe according to an embodiment of the present invention.

An embodiment of the present invention will now be specifically described.

In this embodiment, magnetism is detected and measured by using a phenomenon that when a paramagnetic seed is fixed in a paramagnetic colloidal particle dispersion liquid and the paramagnetic seed is made to come closer to a magnetic field, paramagnetic colloidal particles in the dispersion liquid are aggregated starting from the paramagnetic seed, which functions as a starting point, in the form of a chain and that the length of the chain-like aggregation depends on the strength of the magnetic field. Note that, in this specification and claims, the term "paramagnetism" also includes superparamagnetism.

It is believed that the chain-like aggregation of the paramagnetic colloidal particles started from the paramagnetic seed is formed as a result of the following process, but the mechanism is not limited thereto. Specifically, (1) the paramagnetic seed made to come closer to a magnetic field is magnetized, (2) paramagnetic colloidal particles dispersed around the paramagnetic seed are then magnetized by a magnetic field emitted from the magnetized paramagnetic seed, and adhere to the paramagnetic seed, (3) furthermore, other paramagnetic colloidal particles dispersed around the magnetized paramagnetic colloidal particles are magnetized by a magnetic field emitted from the magnetized paramagnetic colloidal particles, and adhere to the magnetized paramagnetic colloidal particles, and (3) is sequentially repeated until magnetism is attenuated.

An example of the tubular container used in this embodiment is a capitally, one end of which is closed. The paramagnetic seed is fixed to the end, and the tubular container is filled with a paramagnetic colloidal particle dispersion liquid. The tubular container is not particularly limited as long as at least one end thereof is closed, and inside of the tubular container can be observed (specifically, as long as the tubular container can contain the dispersion liquid and aggregation of the paramagnetic colloidal particles can be observed from the outside).

In the case where a chain-like aggregation of paramagnetic colloidal particles is detected by a change in the light transmittance of a dispersion liquid of the paramagnetic colloidal particles, when a tubular container has a high light transmittance to light of a light source used, the change in the light transmittance of the dispersion liquid can be detected with a high sensitivity. Therefore, the type of material constituting the tubular container may be appropriately selected in accordance with the wavelength of the light source used. Specific examples of the material constituting the container include, but are not limited to, transparent materials such as glass and light-transmissive resins (e.g., acrylic resins).

The cross-sectional shape of the tubular container is not limited. Examples thereof include, but are not limited to, a circular shape and a rectangular shape. The size of the tubular container is not limited. For example, the tubular container may have an inner diameter in the range of 0.01 to 3 mm and a length in the range of 1 to 5 mm.

The paramagnetic seed fixed to an end of the tubular container is not particularly limited as long as the paramagnetic seed can be fixed to the end of the tubular container and has paramagnetism.

The particle diameter of the paramagnetic seed is not limited. However, as the particle diameter of the paramagnetic seed decreases, the resolution of the magnetic probe tends to increase. The particle diameter of the paramagnetic seed may be, for example, in the range of about 8 to 30 nm, and furthermore, in the range of about 10 to 40 nm. Herein, the term "particle diameter" refers to a biaxial average diameter, i.e., the average of the minor axis and the major axis. Here, the terms "minor axis" and "major axis" refer to a short side and a long side, respectively, of a rectangle with a minimum area circumscribed to a projected image of a particle.

The strength of the magnetization of the paramagnetic seed in a magnetic field of 1,000 Oe may be in the range of about 20 to 30 emu/g, and furthermore, in the range of about 40 to 100 emu/g.

Specific examples of the paramagnetic seed include: a paramagnetic powder; a particle composed of a polymer material in which a paramagnetic powder is dispersed; a core particle composed of a polymer material, with a paramagnetic powder being adhered to the surface of the core particle; and a carrier particle which carries a paramagnetic powder.

Specific examples of the paramagnetic powder include, but are not limited to, powders of iron oxides such as magnetite, hematite, and ferrite. The particle diameter of the paramagnetic powder may be, for example, in the range of about 1 to 10 nm. The magnetic powder exhibits superparamagnetism when the particle diameter of a magnetic powder is within this range, but, the magnetic property of the magnetic powder tends to shift to ferromagnetism when the particle diameter is excessively large.

Specific examples of the polymer material described above include, but are not limited to, polystyrene, styrene copolymers, and polyesters. The concentration of the paramagnetic powder in the paramagnetic seed may be, for example, 3.0 g/cm$^3$ or more.

The number of paramagnetic seeds fixed to an end of the tubular container is not limited, and may be one or two or more. When the strength of the magnetization of a paramagnetic seed is the same, the size of a paramagnetic colloidal particle that can be drawn to the paramagnetic seed tends to increase as the number of the paramagnetic seeds increases.

Acicular (rod-shaped) particles may also be used as the paramagnetic seed. The aspect ratio (the ratio of the major axis to the minor axis) of the acicular particle may be 1.5 or more, 20 or more, and furthermore, 250 or more. Here, the terms "minor axis" and "major axis" refer to a short side and a long side, respectively, of a rectangle with a minimum area circumscribed to a projected image of the particle. The minor axis of the paramagnetic seed may be in the range of about 8 to 30 nm, and furthermore, in the range of about 10 to 40 nm.

When an acicular particle is used as the paramagnetic seed, the sensitivity and the resolution of the magnetic probe tend to become high.

Examples of the paramagnetic seed composed of an acicular particle include an acicular paramagnetic powder and a seed in which a paramagnetic powder is arranged in the form of a needle.

The reason why the sensitivity of the magnetic probe increases (a relatively long chain-like aggregation is formed even in a weak magnetic field) when an acicular particle is used as the paramagnetic seed is believed to be as follows, but is not limited thereto.

The strength of the magnetic field generated from a magnetic material at a position located away from the magnetic material by a distance r is proportional to $1/r^3$ when the magnetic material has a spherical shape, whereas the strength of the magnetic field is proportional to $1/r^2$ when the magnetic material has an acicular (rod-like) shape. Therefore, the magnetism is more gradually attenuated when the paramagnetic seed has an acicular (rod-like) shape. As a result, a chain-like aggregation of paramagnetic colloidal particles linked to the paramagnetic seed tends to become long, and thus the sensitivity increases.

Furthermore, the reason why the spatial resolution of the magnetic probe becomes high when an acicular particle is used as the paramagnetic seed is believed to be as follows, but is not limited thereto.

It is believed that spherical paramagnetic materials can be magnetized by a magnetic field of any direction since spherical paramagnetic materials have isotropy and have no anisotropy in a direction to be magnetized. Accordingly, when a spherical seed is used as the paramagnetic seed, the paramagnetic seed is magnetized not only by a magnetic field generated directly under the paramagnetic seed but also by a magnetic field generated in the vicinity of the paramagnetic seed, and the magnetic probe may detect the latter magnetic field. Consequently, it is believed that the spatial resolution tends to be larger than the particle diameter of the paramagnetic seed.

In contrast, it is believed that acicular paramagnetic materials can be magnetized only in the major axis direction since acicular (rod-shaped) paramagnetic materials have anisotropy. Therefore, when an acicular particle is used as the paramagnetic seed and the paramagnetic seed is fixed to a magnetic probe such that the major axis of the paramagnetic seed corresponds to the longitudinal direction of the magnetic probe, the magnetic probe detects only a magnetic field generated directly under the paramagnetic seed. Consequently, it is believed that such a magnetic probe can realize the same spatial resolution as the dimension of the particle diameter (minor axis) of the paramagnetic seed.

Examples of the paramagnetic seed in which a paramagnetic powder is arranged in the form of a needle include a acicular particle composed of a polymer material in which a paramagnetic powder is dispersed, a acicular particle composed of a polymer material to the surface of which a paramagnetic powder is adhered, and a an acicular carrier such as a carbon nanotube which carry a paramagnetic powder.

The paramagnetic powder used in this case may have an acicular shape or may not have an acicular shape. Even if each particle of the paramagnetic powder does not have an acicular shape, an aggregate (paramagnetic body) prepared by arranging a plurality of such particles in the form of a needle also has anisotropy in the same way as an acicular paramagnetic powder.

A method of producing the paramagnetic seed in which a paramagnetic powder is arranged in the form of a needle is not limited. Such a paramagnetic seed can be produced by a known method disclosed in, for example, Nano Lett., Vol. 5 No. 5, p. 879-884 (2005).

The paramagnetic seed is fixed to the inside or the outside of an end of the tubular container. A method of fixing the paramagnetic seed is not limited, and a known method can be employed. For example, either one of or both of the end of the tubular container and the paramagnetic seed may be subjected to a surface chemical modification, and the paramagnetic seed may be chemically fixed to the end of the tubular container by a bond (ionic bond, covalent bond, or the like) of a surface chemical modification group. Alternatively, the paramagnetic seed may be physically bonded and fixed to the end of the tubular container using a polymer material or the like.

Next, the paramagnetic colloidal particle dispersion liquid will be described. Paramagnetic colloidal particles in the paramagnetic colloidal particle dispersion liquid used in this embodiment are not particularly limited as long as the particles have paramagnetism, and may be a solid or a liquid.

Specific examples of the paramagnetic colloidal particles include the same particles as those described in the above-mentioned explanation and specific examples of the paramagnetic seed. The concentration of the paramagnetic powder in the paramagnetic colloidal particles may be, for example, in the range of 1 to 10 g/cm$^3$.

The particle diameter of the paramagnetic colloidal particles is not particularly limited as long as the particles can be dispersed in a dispersion medium. In general, when the particle diameter of the paramagnetic colloidal particles used as a dispersoid is small, stable dispersion can be realized. In this embodiment, the particle diameter of the paramagnetic colloidal particles may be in the range of about 10 nm to 50 μm, and furthermore, in the range of about 50 nm to 3 μm. Here, the term "particle diameter" refers to the Stokes diameter measured by a laser diffraction/light scattering method.

The strength of the magnetization of the paramagnetic colloidal particles in a magnetic field of 1,000 Oe may be in the range of about 1 to 1,000 emu/g, and furthermore, in the range of about 10 to 100 emu/g.

In the case where a chain-like aggregation of the paramagnetic colloidal particles is detected by a change in the light transmittance of a paramagnetic colloidal particle dispersion liquid, in order to increase the absorptivity or reflectivity to light used in the measurement of the light transmittance, the surfaces of the magnetic particles may be coated with a material having a high absorptivity or reflectivity to light of a light source for the measurement. A specific example of the coating material is gold (Au), but is not limited to this.

The dispersion medium of the dispersion liquid is not particularly limited as long as paramagnetic colloidal particles can be dispersed therein and aggregation of the paramagnetic colloidal particles can be observed.

When the dispersion of the magnetic particles in the dispersion medium is stable, stable detection and quantification can be performed. Accordingly, the type of dispersion medium may be appropriately selected in accordance with magnetic particles used so as to realize stable dispersion. In order to stabilize the dispersion of the magnetic particles in the dispersion medium, a surfactant may also be used.

In the case where a chain-like aggregation of the paramagnetic colloidal particles is detected by a change in the light transmittance of a paramagnetic colloidal particle dispersion liquid, when the light transmittance of the dispersion medium to light of a light source used is high, the change in the light transmittance of the dispersion liquid due to an alignment of the magnetic particles can be detected with a high sensitivity. Accordingly, the type of dispersion medium may be appropriately selected in accordance with the wavelength of the light source used.

Specific examples of the dispersion medium include, but are not limited to, aqueous solvents such as water and physiological saline, and organic solvents such as ethanol.

A dispersion medium having a low viscosity is advantageous in that a movement (aggregation) of paramagnetic colloidal particles readily occurs when the dispersion liquid is subjected to the effect of a magnetic field, and thus the time required for the detection can be decreased. On the other hand, a dispersion medium having a high viscosity is advantageous in that such a dispersion medium prevents aggregation of paramagnetic colloidal particles formed by the effect of a magnetic field from being disordered by external vibrations or the like, and thus a stable detection can be realized.

The viscosity of the dispersion medium may be appropriately adjusted by, for example, selecting a suitable type of dispersion medium or adding a viscosity modifier.

The concentration of the paramagnetic colloidal particles in the dispersion liquid is not particularly limited, and may be, for example, in the range of 0.1 to 10 volume percent.

Magnetism is detected and measured by scanning a surface of a measurement target with the end, i.e., the portion to which the paramagnetic seed is fixed, of the magnetic probe of this embodiment, or moving the end of the magnetic probe close to an area where magnetism may be generated. When magnetism is generated under the end of the magnetic probe, the paramagnetic colloidal particles are aggregated in the form of a chain in the dispersion liquid at the end of the magnetic probe.

When the paramagnetic colloidal particles have a relatively large particle diameter, the presence or absence of aggregation of the paramagnetic colloidal particles is confirmed by visual observation or image processing, thus the presence or absence of a magnetic field can be detected.

Alternatively, the presence or absence of aggregation of the paramagnetic colloidal particles can be confirmed by a change in the light transmittance of the dispersion liquid (light transmittance in a direction of the cross section of the tubular container). More specifically, a portion where the paramagnetic colloidal particles are aggregated in the form of a chain has a lower light transmittance than that in a portion where the paramagnetic colloidal particles are not aggregated. Accordingly, the presence or absence of a magnetic field can be detected by measuring the light transmittance of the dispersion liquid in the tubular container near the end of the container and the light transmittance of the dispersion liquid in a portion where aggregation does not occur (for example, near the opposite end), and checking the presence or absence of a difference in the light transmittance.

The length of a chain-like aggregation depends on the strength of a magnetic field. Therefore, the strength of the magnetic field can be determined by measuring the length of the chain-like aggregation and then comparing the measured length with a calibration curve prepared in advance.

The length of the chain-like aggregation may be determined by visual observation or image processing. Alternatively, for example, the light transmittance may be sequentially measured from an end to another end of the tubular container, and the length of the chain-like aggregation may be determined by specifying a position at which the light transmittance is changed. However, the method of measuring the length of the chain-like aggregation is not limited thereto.

In the case where a chain-like aggregation of paramagnetic colloidal particles is detected by a change in the light transmittance of a paramagnetic colloidal particle dispersion liquid, light used in measuring the light transmittance of the dispersion liquid is not particularly limited as long as the light has a wavelength that can pass through the tubular container. For example, unpolarized light having a wavelength in the range of 400 to 1,000 nm may be used.

The light source used is not particularly limited as long as the light source can emit light with a wavelength that can pass through a container including a dispersion liquid therein at a detectable strength. Specific examples of the light source include, but are not limited to, laser light sources and light sources of diffused light such as an incandescent lamp and a fluorescent lamp.

The light transmittance may be measured by visual observation. Alternatively, a means for measuring the intensity of light that is transmitted through the dispersion liquid may be disposed at the opposite side of the light source across the dispersion liquid, and the light transmittance may be measured with this means. The means for measuring light intensity measurement is not particularly limited as long as it can measure the intensity of light that is transmitted through the tubular container.

The means for measuring light intensity can be disposed at a position at which light passed through the tubular container can be received, that is, at a position facing the light source across the container. In order to perform a stable measurement, the distance between the tubular container and the means for measuring light intensity or the position of the means for measuring relative to the tubular container may be fixed.

The means for measuring light intensity may include a means for recording the displacement from the end of a position and the light transmittance at the position and a means for determining the length of aggregation of paramagnetic colloidal particles on the basis of information recorded by the means for recording. Furthermore, a means for memorizing the relationship between the length of aggregation and the strength of the magnetic field, which is measured in advance, (information of a calibration curve) may be connected to the means for determining.

A specific example of the magnetic probe according to this embodiment will now be described with reference to a drawing.

FIG. 1 is a schematic view of an example of a magnetic probe 30 of this embodiment. A paramagnetic seed 31 is fixed to the inside of an end of this magnetic probe 30. The magnetic probe 30 includes a tubular container 34, a light source 35, and a means for measuring light intensity 36 facing the light source 35 across the tubular container 34. A paramagnetic colloidal particle dispersion liquid prepared by dispersing paramagnetic colloidal particles 32 in a dispersion medium 33 is placed in the tubular container 34.

In the example shown in FIG. 1, one carbon nanotube (inner diameter: about 20 nm) in which 100 $Fe_2O_3$ particles having an average particle diameter of 10 nm are filled is used as the paramagnetic seed 31, magnetic beads manufactured by Micromer (polystyrene fine particles in which $Fe_2O_3$ particles having an average particle diameter of 8 nm are dispersed, average particle diameter: 250 nm, the magnetization in a magnetic field of 1,000 Oe: 43 emu/g) are used as the paramagnetic colloidal particles 32, pure water (having a concentration of the paramagnetic colloidal particles of 10 volume percent) is used as the dispersion medium 33, a glass capillary having an inner diameter of 0.5 mm and a height of 2.0 mm is used as the tubular container 34, and an incandescent lamp (tungsten lamp) is used as the light source 35.

The paramagnetic seed 31 (carbon nanotube) can be fixed to the end of the capillary by placing the carbon nanotube at a predetermined position of the capillary and irradiating a contact point between the carbon nanotube and the capillary with an electron beam. More specifically, the carbon nanotube is brought into contact with the inside of the end of the glass capillary and the contact point is irradiated with the electron beam while observing the capillary with a scanning electron microscope using, for example, a micromanipulator manufactured by Kleindiek Nanotechnik.

The light source 35 and the means for measuring light intensity 36 are placed so as to be movable in the longitudinal direction of the capillary. Thus, the light transmittance of the capillary (intensity of transmitted light) at an arbitrary displacement X from the end of the capillary can be measured.

An information processing means (not shown) is optionally connected to the means for measuring light intensity 36 with or without wires. The information processing means includes: a means for recording the displacement X from the end of the capillary at any position and the intensity I of light transmitted through the capillary at any such position; and a means for determining the length of a chain-like aggregation of the paramagnetic colloidal particles on the basis of information recorded by the recording means. A calibration curve information memorizing means, which memorize a relationship between the length of a chain-like aggregation and the strength of a magnetic field, the relationship being determined in advance using magnetic fields whose strength is known, is connected to the determining means.

EXAMPLES

The present invention will now be described in detail on the basis of Examples, but the present invention is not limited to Examples below.

Example 1

A silicon oxide substrate was prepared. A surface of the silicon oxide substrate was modified with 3-(2-aminoethylamino)propyltrimethoxysilane in a grid pattern (at intervals of 30 μm and the area of each grid point being about 5 μm×5 μm). Subsequently, a paramagnetic (superparamagnetic) seed (carboxyl group-modified $Fe_2O_3$ (magnetite) particles (manufactured by Micromod Partikeltechnologie GmbH (Germany), Nanomag-D PEG-COOH), particle diameter: about 130 nm, the magnetization in a magnetic field of 1,000 Oe: 43 emu/g) was fixed to the portions modified with 3-(2-aminoethylamino)propyltrimethoxysilane. In this step, about 20 carboxyl group-modified magnetite particles were fixed in each area of about 5 μm×5 μm by an ionic bond between the terminal amino group of the 3-(2-aminoethylamino)propyltrimethoxysilane and the carboxyl group of the paramagnetic seed.

Furthermore, paramagnetic particles (polymer-carboxyl group-modified $Fe_2O_3$ (magnetite) particles) (manufactured by Dynal Biotech, M-270) having an average particle diameter of 2.8 μm were dispersed in pure water such that paramagnetic particles:water (volume ratio)=1:10, thus preparing a colloidal dispersion liquid.

Subsequently, the silicon oxide substrate on which the paramagnetic seed was fixed was placed in a petri dish, and the above paramagnetic colloidal particle dispersion liquid was poured into the petri dish. The petri dish was left still on an external magnetic field (permanent magnet) of about 250 Oe.

Figure 2:
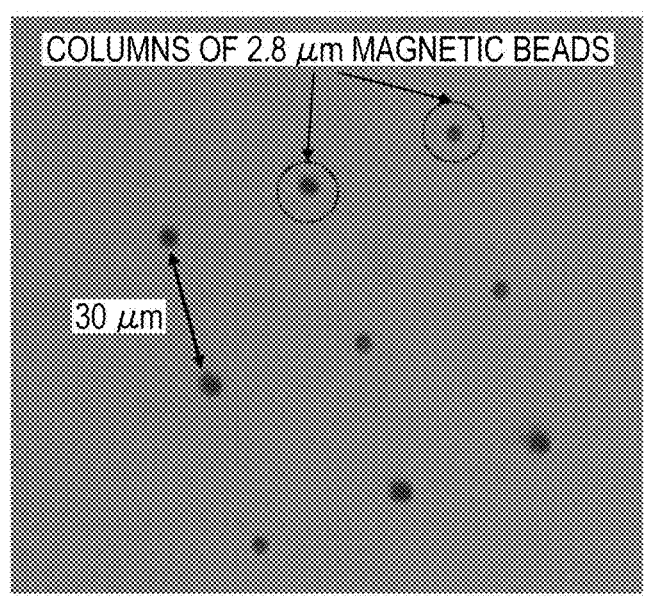
FIG. 2 is a photograph of a phenomenon used in the present invention.

FIG. 2 is a photograph of this system when viewed from directly above. It was confirmed that the paramagnetic colloidal particles were trapped in each of the areas where the paramagnetic seed was fixed, and linked to form a chain-like aggregation. In this system, by shifting the magnetic field to tilt the chain-like aggregation, it was confirmed that about eight paramagnetic colloidal particles were linked and aggregated in each of the areas.

Example 2

A silicon oxide substrate was prepared. Gold (Au) was deposited on a surface of the silicon oxide substrate in a grid pattern (at intervals of 30 μm and the area of each grid point being about 5 μm×5 μm). Subsequently, a (superparamagnetic) seed (thiol group-modified $Fe_2O_3$ (magnetite) particles, particle diameter: about 8 nm) was fixed to the portions where Au was deposited. In this step, about 500 thiol group-modified magnetite particles were fixed in each area of about 5 μm×5 μm by a chemical reaction between the Au and the thiol group of the paramagnetic seed.

Subsequently, the silicon oxide substrate on which the paramagnetic seed was fixed was placed in a petri dish. The same paramagnetic colloidal particle dispersion liquid as that prepared in Example 1 was poured into the petri dish.

Figure 3A:
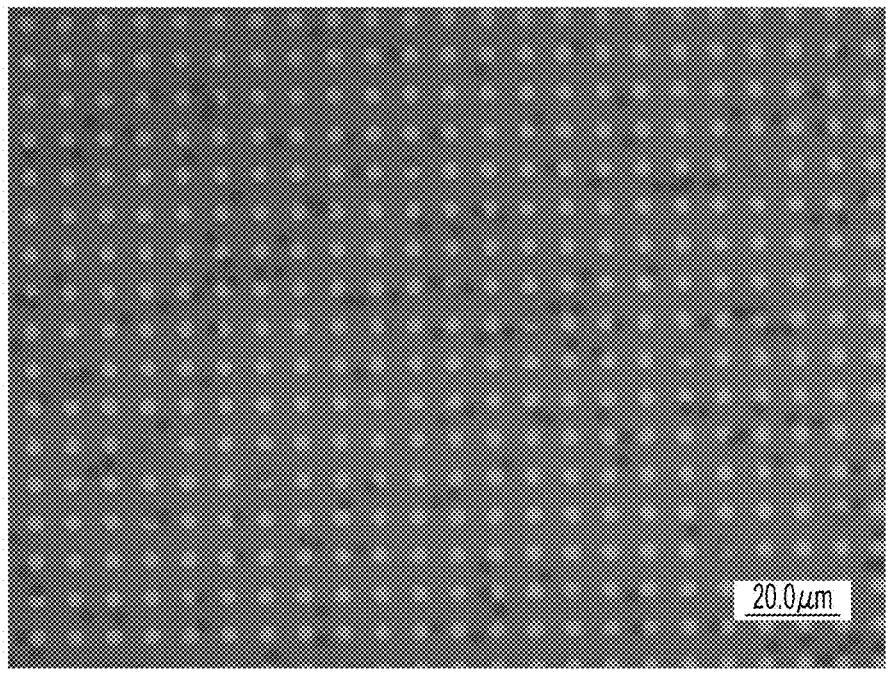
FIG. 3A is a photograph of a phenomenon used in the present invention.

FIG. 3A is a photograph of this system when viewed from directly above. In FIG. 3A, portions that look white are areas where Au was deposited, and circles that look black are the paramagnetic colloidal particles. It was confirmed that the paramagnetic colloidal particles were dispersed at random.

Figure 3B:
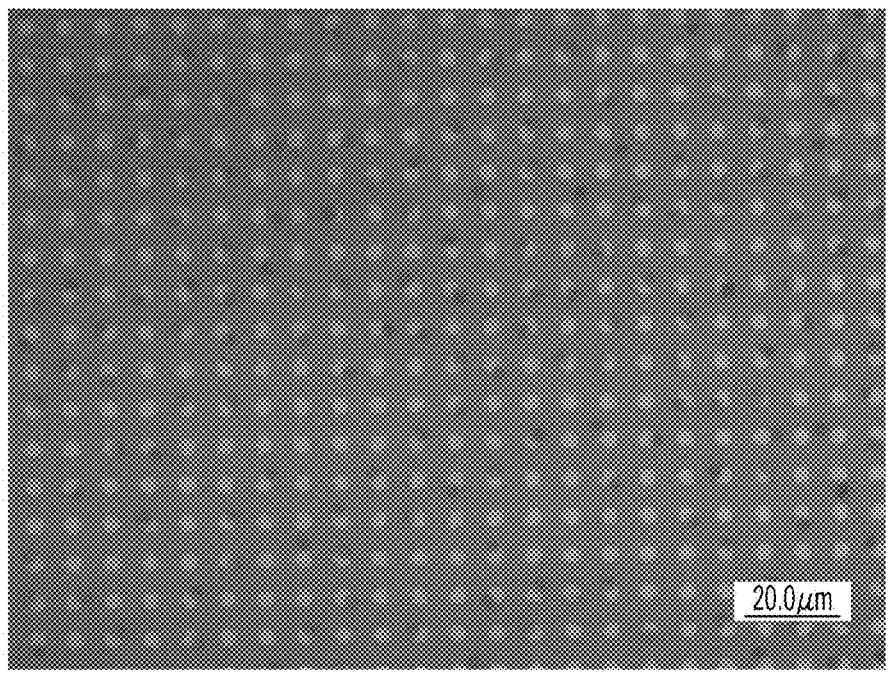
FIG. 3B is a photograph of the phenomenon used in the present invention.

Subsequently, a coil having a diameter of 60 mm was placed directly under the petri dish. A direct current of 1 A was applied to the coil to generate a vertical magnetic field of 73 G. FIG. 3B is a photograph of this system when viewed from directly above. It was confirmed that the paramagnetic colloidal particles were trapped in the areas where Au was deposited. Furthermore, from the fact that the number of paramagnetic particles that could be observed in FIG. 3B was smaller than that in FIG. 3A, it was confirmed that the paramagnetic colloidal particles were linked in a direction perpendicular to the plane of the screen.

INDUSTRIAL APPLICABILITY

The magnetic probe of the present invention can be used for detecting magnetism. In particular, the magnetic probe of the present invention has a very high resolution, and thus it can be used for a magnetic microscope or reading in magnetic recording.

EXPLANATION OF THE SYMBOLS 30 magnetic probe
31 paramagnetic seed
32 paramagnetic colloidal particle
33 dispersion medium
34 tubular container
35 light source
36 means for measuring light intensity

What is claimed is:

1. A magnetic probe comprising:
    a tubular container, the inside of which can be observed and at least one end of which is closed;
    a paramagnetic seed which is fixed to an end of the tubular container and which comprises a carbon nanotube and a paramagnetic powder that is filled inside the carbon nanotube;
    a paramagnetic colloidal particle dispersion liquid that is filled in the tubular container; and
    a means for measuring a light transmittance of the tubular container.

2. A magnetic probe comprising:
    a tubular container, the inside of which can be observed and at least one end of which is closed;
    a paramagnetic seed which is fixed to an end of the tubular container; and
    a paramagnetic colloidal particle dispersion liquid that is filled in the tubular container.

3. The magnetic probe according to claim 2, wherein the paramagnetic seed comprises an acicular particle.

4. The magnetic probe according to claim 2, wherein the paramagnetic seed comprises a carbon nanotube and a paramagnetic powder that is filled inside the carbon nanotube.

5. The magnetic probe according to claim 2, further comprising:
    a means for measuring a light transmittance of the tubular container.

6. A magnetic recording/reproducing apparatus comprising the magnetic probe according to claim 2.

7. A magnetic microscope comprising the magnetic probe according to claim 2.

8. A method of detecting magnetism comprising:
    disposing a magnetic probe comprising a tubular container, the inside of which can be observed and at least one end of which is closed, a paramagnetic seed which is fixed to an end of the tubular container, and a dispersion liquid of paramagnetic colloidal particles, the dispersion liquid being filled in the tubular container;
    allowing the paramagnetic colloidal particles to sequentially adhere to the paramagnetic seed; and
    measuring a light transmittance of the tubular container.

* * * * *